(12) United States Patent
Eskildsen et al.

(10) Patent No.: US 7,823,279 B2
(45) Date of Patent: Nov. 2, 2010

(54) METHOD FOR USING AN IN PACKAGE POWER SUPPLY TO SUPPLY POWER TO AN INTEGRATED CIRCUIT AND TO A COMPONENT

(75) Inventors: Steven R. Eskildsen, Folsom, CA (US); Duane R. Mills, Shingle Springs, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/113,502

(22) Filed: Apr. 1, 2002

(65) Prior Publication Data

US 2003/0184963 A1    Oct. 2, 2003

(51) Int. Cl.
*H01R 43/00* (2006.01)
(52) U.S. Cl. .......... 29/854; 29/25.01; 29/830; 29/832; 29/840
(58) Field of Classification Search .......... 29/25.01, 29/739, 741, 829, 830, 831, 842, 846, 848, 29/854; 361/760, 761; 327/393, 172, 132, 327/263, 536, 589; 307/29, 38; 365/226, 365/229, 203, 204, 227, 228; 320/103, 106, 320/107, 114; 710/300, 301; 323/354, 369, 323/293, 297
See application file for complete search history.

(56) References Cited

U.S. PATENT DOCUMENTS

| | | | | |
|---|---|---|---|---|
| 3,427,599 A | * | 2/1969 | McKeever | 365/160 |
| 3,893,235 A | * | 7/1975 | Keough | 29/830 |
| 4,227,257 A | * | 10/1980 | Sato | 455/343.1 |
| 4,365,316 A | * | 12/1982 | Iwahashi et al. | 365/72 |
| 4,675,989 A | * | 6/1987 | Galloway et al. | 29/622 |
| 4,709,468 A | * | 12/1987 | Wilson | 29/834 |
| 4,759,123 A | * | 7/1988 | Ohta et al. | 29/832 |
| 4,874,960 A | * | 10/1989 | Cybela et al. | 307/64 |
| 4,907,183 A | * | 3/1990 | Tanaka | 713/340 |
| 5,101,119 A | * | 3/1992 | Yoshimori et al. | 326/33 |
| 5,129,091 A | * | 7/1992 | Yorimoto et al. | 713/323 |
| 5,144,586 A | * | 9/1992 | Faraci | 365/226 |
| 5,153,710 A | * | 10/1992 | McCain | 257/724 |
| 5,153,719 A | * | 10/1992 | Ibenthal | 348/699 |
| 5,271,152 A | * | 12/1993 | Murphy | 29/830 |
| 5,294,829 A | * | 3/1994 | Hundt | 257/678 |
| 5,325,262 A | * | 6/1994 | Ma | 361/681 |
| 5,469,399 A | * | 11/1995 | Sato et al. | 365/226 |
| 5,473,496 A | * | 12/1995 | Rouy | 361/18 |
| 5,522,049 A | * | 5/1996 | Kimura et al. | 710/301 |
| 5,572,478 A | * | 11/1996 | Sato et al. | 365/226 |
| 5,581,498 A | | 12/1996 | Ludwig et al. | |
| 5,610,800 A | * | 3/1997 | Hundt et al. | 361/761 |
| 5,616,968 A | * | 4/1997 | Fujii et al. | 307/66 |

(Continued)

FOREIGN PATENT DOCUMENTS

DE    100 47 963 A1    3/2001

(Continued)

*Primary Examiner*—Derris H Banks
*Assistant Examiner*—Tai Nguyen
(74) *Attorney, Agent, or Firm*—Trop, Pruner & Hu, P.C.

(57) ABSTRACT

A packaged device may be provided with an in package power supply. The in package power supply may be selectively coupled to another component when the packaged device is not active.

8 Claims, 3 Drawing Sheets

U.S. PATENT DOCUMENTS

| | | |
|---|---|---|
| 5,623,448 A | 4/1997 | Koelling |
| 5,629,644 A * | 5/1997 | Chevallier .................. 327/393 |
| 5,661,685 A * | 8/1997 | Lee et al. ............... 365/185.22 |
| 5,734,618 A * | 3/1998 | Mizuta ....................... 365/229 |
| 5,790,384 A | 8/1998 | Ahmad et al. |
| 5,802,274 A * | 9/1998 | Dorak et al. ................ 713/200 |
| 5,889,722 A * | 3/1999 | Numazaki et al. .......... 365/226 |
| 5,973,392 A | 10/1999 | Senba et al. |
| 6,005,778 A | 12/1999 | Spielberger et al. |
| 6,016,017 A * | 1/2000 | Kadanka et al. .............. 307/64 |
| 6,020,775 A * | 2/2000 | Chevallier .................. 327/393 |
| 6,041,400 A * | 3/2000 | Ozcelik et al. ............... 712/35 |
| 6,137,164 A | 10/2000 | Yew et al. |
| 6,218,806 B1 * | 4/2001 | Brotto et al. ................ 320/106 |
| 6,242,892 B1 * | 6/2001 | Arnaud et al. .............. 320/135 |
| 6,335,566 B1 | 1/2002 | Hirashima et al. |
| 6,496,049 B2 * | 12/2002 | Tsukagoshi et al. ......... 327/322 |
| 6,503,778 B1 | 1/2003 | Yamauchi et al. |
| 6,614,210 B2 * | 9/2003 | Sundaram et al. .......... 323/354 |

FOREIGN PATENT DOCUMENTS

| | | |
|---|---|---|
| DE | 10047963 A1 | 3/2001 |
| EP | 0892434 A2 | 7/1997 |
| WO | WO 99/27537 | 6/1999 |
| WO | WO 00/04595 | 1/2000 |

* cited by examiner

METHOD FOR USING AN IN PACKAGE POWER SUPPLY TO SUPPLY POWER TO AN INTEGRATED CIRCUIT AND TO A COMPONENT

BACKGROUND

This invention relates generally to techniques for providing a source of power to an integrated circuit.

All integrated circuits require a power supply. Commonly, the power supply is its own integrated circuit, which electrically couples to the powered device. For example, the powered device and the power supply may both be attached to a printed circuit board and connected to one another through electrical traces on the circuit board. As a result of the need for a separate integrated circuit to supply power, the overall size and cost of the resulting components may be increased.

Thus, it would be desirable to provide a power supply that reduces the size and/or cost of the end electrical product.

DETAILED DESCRIPTION

Figure 1:
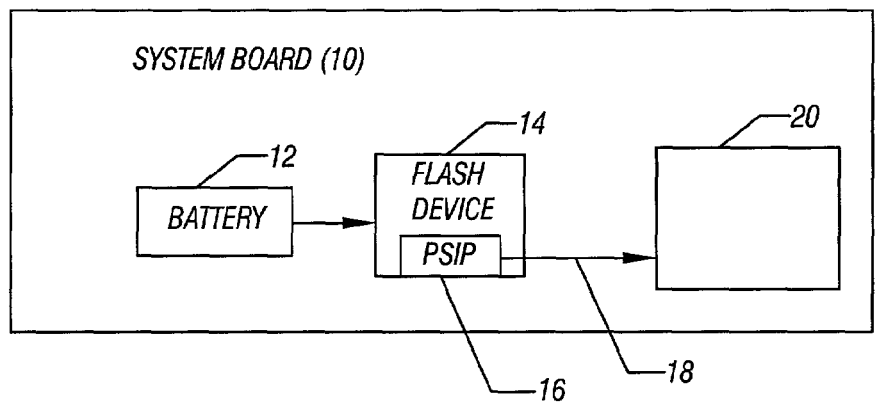
FIG. 1 is a schematic depiction of one embodiment of the present invention.

Referring to FIG. 1, a system board 10 may mount a battery 12 coupled to an integrated circuit device 14 that may be a flash memory, for example. The device 14 may include a power supply in package (PSIP) 16 in one embodiment of the present invention. In effect, the power supply is integrated right into the same integrated circuit package that forms the device 14. This may result in considerable cost and/or size reduction of the resulting board 10.

However, other integrated circuits on the same board, such as integrated circuit 20, may then need a power supply. The integrated circuit 20 could be supplied by a separate integrated circuit power supply. However, the use of separate power supplies partially defeats the purpose of integrating the power supply into the device 14.

Many types of devices on a system board 10 of processor-based systems may not be activated at the same time. For example, different types of memory sharing the same data bus may never be activated at the same time. As one example, a flash memory device is generally not activated at the same time a static random access memory (SRAM) is accessed. Thus, whenever the device 14 is not being utilized, its PSIP 16 may be electrically coupled by a link 18 to an integrated circuit 20. For example, the link 18 may be a metal line on a printed circuit board in an embodiment where the board 10 is a printed circuit board. Thus, when the device 14 is in operation, it receives power from the PSIP 16. When the device 14 is not in operation, the power from the PSIP 16 may be supplied to another, active integrated circuit, such as the integrated circuit 20.

As a result, the size of the system board 10 may be decreased because it is not necessary to provide additional power supplies for each component. Therefore, the cost of the system board 10 may also be reduced. The cost of integrated circuit 20 may also be reduced since it may not need its own PSIP circuitry.

Figure 2:
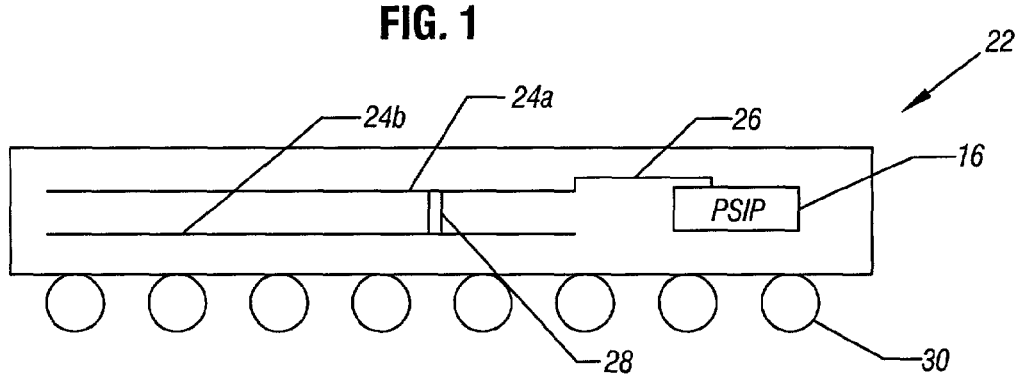
FIG. 2 is an enlarged, cross-sectional view of another embodiment of the present invention.

Referring to FIG. 2, a packaged integrated circuit 22 may include a pair of spaced dice 24a and 24b, one positioned above the other, in one embodiment of the present invention. The die 24a may be coupled to a PSIP 16 via a link 26. The die 24b may be coupled to the die 24a to receive power from the PSIP 16. As long as the dice 24a and 24b are not operated at the same time, as described previously, a single in package power supply 16 may be utilized to supply both dice 24a and 24b, for example, using an electrical coupling 28 to supply power to the die 24b through the die 24a.

In one embodiment, the packaged integrated circuit 22 may include a plurality of solder balls 30 to make external contacts. However, other package architectures may be utilized as well.

Figure 3:
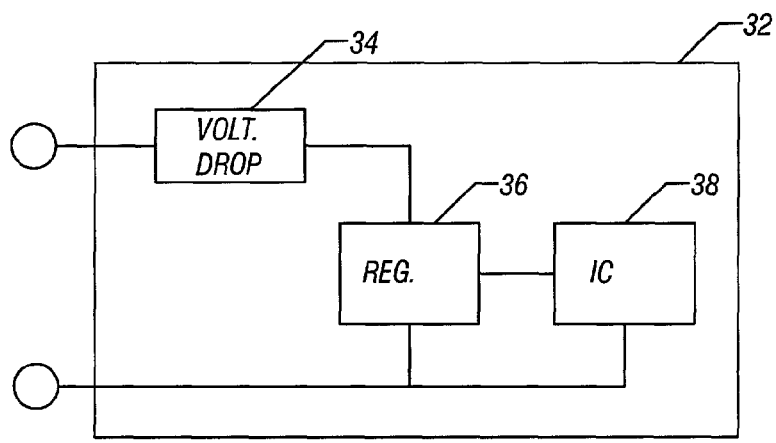
FIG. 3 is a schematic depiction of still another embodiment of the present invention.

Referring to FIG. 3, an electronic system 32 may include a plurality of integrated circuits including the integrated circuit (IC) 38. If the regulator 36 and integrated circuit 38 combination uses a lower supply voltage than other components of the system 32, it is difficult to test all the components in the system 32 using a single power supply.

However, a single power supply may be utilized and a voltage dropping circuit element 34 may be connected to that power supply. Then the integrated circuit 38 and regulator 36 combination may receive a lower voltage even though the system 32 only generates a single test voltage. In particular, the input supply voltage supplied to the system 32 may be dropped by the voltage dropping circuit element 34 and then supplied to a voltage regulator 36. The lower voltage regulator 36 in turn provides the regulated voltage to the integrated circuit 38.

The voltage dropping circuit element 34 may simply be one or more transistors or diodes in some embodiments. Each of the transistors or diodes may drop the supply voltage by 0.7 volts, or any other threshold voltage, or multiples thereof.

Figure 4:
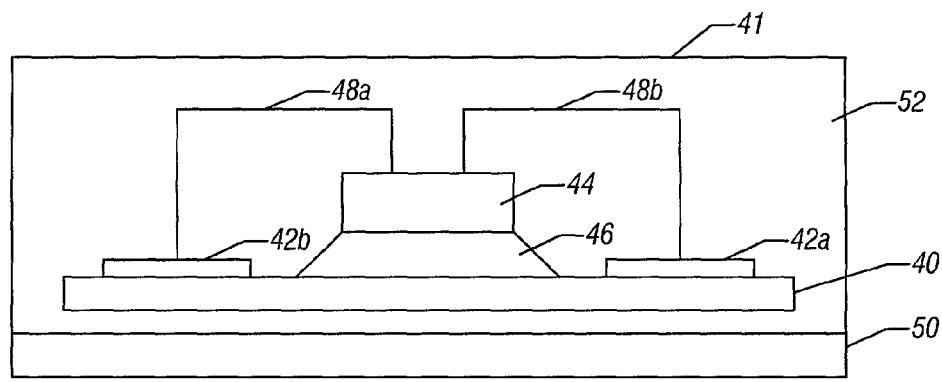
FIG. 4 is an enlarged, cross-sectional view of yet another embodiment of the present invention.

Referring to FIG. 4, an integrated circuit package 41 may include a substrate 50 in one embodiment. An encapsulant 52 may encapsulate an integrated circuit die 40. The die 40 may include its own discrete component 44 for purposes of supplying a supply voltage from within the package 41. For example, the discrete component 44 may be an integrated inductor or capacitor.

The discrete component 44 may be secured by a suitable adhesive 46, in one embodiment, to the integrated circuit die 40. The discrete component 44 may be electrically coupled to bond pads 42a and 42b on the integrated circuit die 40 through wire bonds 48a and 48b. The use of wire bonds facilitates the attachment of the discrete component 44 electrically to the integrated circuit die 40. Thus, an integrated circuit package 41 may include its own power supply, with discrete components, all packaged together.

A wire bond from the discrete component 44 may also be attached to the substrate in another embodiment. The discrete component 44 may also be adhesively attached to the substrate 50 and may be wire bonded to the substrate 50 in another embodiment.

Figure 5:
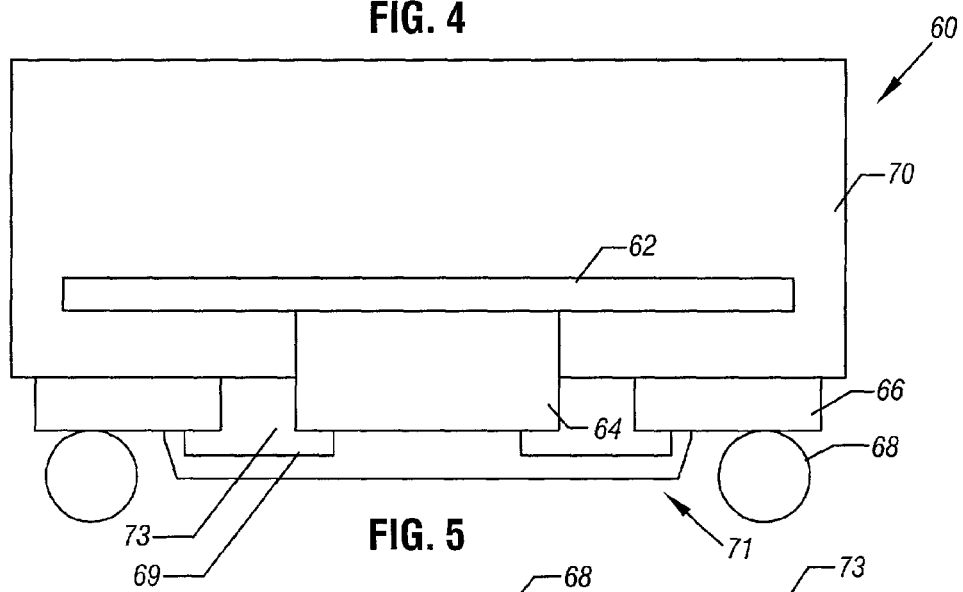
FIG. 5 is an enlarged, cross-sectional view of still another embodiment of the present invention.
Figure 6:
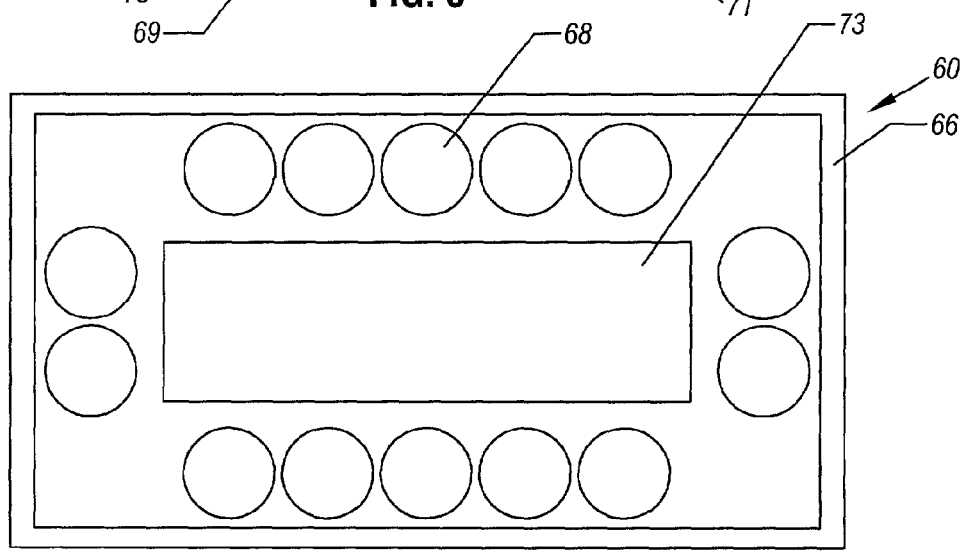
FIG. 6 is a bottom plan view of the embodiment shown in FIG. 5.

Turning next to FIGS. 5 and 6, an integrated circuit package 60 may include a die 62 within an encapsulant 70 in one embodiment of the present invention. A discrete component 64 may be secured to the underside of the die 62. Again, the discrete component 64 may be an integrated capacitor or inductor, or other component to enable an in package power supply. A substrate 66 is formed on the lower surface of the encapsulant 70. However, the substrate 66 has an open central portion 71 that allows for the passage of the discrete component 64.

As a result, the package 60 may have a lower profile because there is no interference between the substrate 66 and the discrete component 64, particularly because of the open central portion 71 of the substrate 66. The substrate 66 may provide electrical connections to the exterior environment, for example, through solder balls 68, in one embodiment. The substrate 66 may also provide wire bond connections 69 to the component 64 that may thereafter be encapsulated with encapsulant 73.

Thus, as shown in FIG. 6, the discrete component 64, incorporated to provide an in package power supply, may protrude through the open central portion 71 in the substrate 66 and may be suspended, without interfering with any underlying structures, through the vertical gap created by the combination of the substrate 66 and the solder balls 68.

Figure 7:
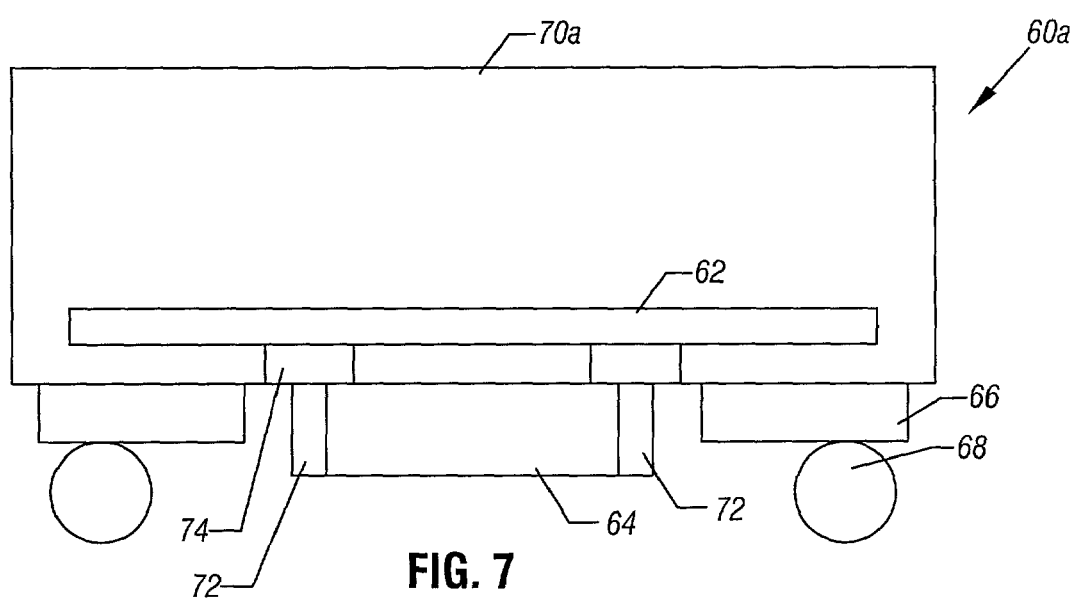
FIG. 7 is an enlarged, cross-sectional view of another embodiment of the present invention.

Referring to FIG. 7, in an alternate embodiment, the package 60a may include an encapsulant 70a. The die 62 may have a pair of contact pads 72 in one embodiment. The contact pads 74 electrically contact metallic coatings 72 on the sides of the discrete component 64. Thus, the component 64 may simply be plugged into the receptacle defined by the contact pads 74.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   supplying power to an integrated circuit packaged in an integrated circuit package using a power supply, said power supply and circuit being packaged in the same integrated circuit package;
   detecting that said integrated circuit is not in operation; and
   selectively supplying power from the power supply to an integrated circuit component external to said integrated circuit package only when the integrated circuit is not in operation.

2. The method of claim 1, wherein supplying power to an integrated circuit comprises supplying power to a memory.

3. The method of claim 1, wherein supplying power to an integrated circuit comprises supplying power to a flash memory.

4. The method of claim 1, wherein supplying power to a component comprises supplying power to a memory.

5. The method of claim 1, wherein supplying power to a component comprises supplying power to a component on a board on which the integrated circuit and the power supply are mounted.

6. The method of claim 1, wherein supplying power to a component comprises supplying power to said component electrically coupled to the integrated circuit to receive power through the integrated circuit.

7. The method of claim 1, wherein supplying power to said component comprises supplying power to said component that uses a supply voltage lower than that used by the integrated circuit.

8. The method of claim 1, wherein supplying power to said component comprises dropping voltage supplied to the component.

* * * * *